United States Patent
Schmidt et al.

(10) Patent No.: US 7,646,766 B2
(45) Date of Patent: Jan. 12, 2010

(54) SIGNAL-PROCESSING DEVICE WITH IMPROVED TRIGGERING

(75) Inventors: Kurt Schmidt, Grafing (DE); Markus Freidhof, Kirchseeon (DE)

(73) Assignee: Rohde & Schwarz GmbH & Co., KG, Munich (DE)

( * ) Notice: Subject to any disclaimer, the term of this patent is extended or adjusted under 35 U.S.C. 154(b) by 343 days.

(21) Appl. No.: 11/587,396

(22) PCT Filed: Apr. 20, 2005

(86) PCT No.: PCT/EP2005/004235

§ 371 (c)(1),
(2), (4) Date: Aug. 10, 2007

(87) PCT Pub. No.: WO2005/103736

PCT Pub. Date: Nov. 3, 2005

(65) Prior Publication Data

US 2008/0130654 A1 Jun. 5, 2008

(30) Foreign Application Priority Data

Apr. 23, 2004 (DE) ................ 10 2004 019 966

(51) Int. Cl.
*H04L 12/50* (2006.01)

(52) U.S. Cl. .................... 370/363; 370/395.7

(58) Field of Classification Search .................. 370/363, 370/367, 371, 374, 378, 381, 383, 386, 395.7, 370/429
See application file for complete search history.

(56) References Cited

U.S. PATENT DOCUMENTS

| 5,537,402 A * | 7/1996 | Notani et al. ............ 370/395.7 |
| 2003/0036872 A1 | 2/2003 | Stark |
| 2003/0220753 A1 | 11/2003 | Pickerd et al. |
| 2004/0117143 A1 | 6/2004 | Tran et al. |

FOREIGN PATENT DOCUMENTS

| DE | 10159911 | 6/2003 |
| EP | 1074845 A2 | 2/2001 |
| EP | 1156338 A2 | 11/2001 |
| JP | 64-76499 | 3/1989 |
| SU | 560321 | 5/1977 |
| WO | PCT/EP2005/004235 | 8/2005 |
| WO | PCT/EP2005/004235 | 11/2006 |

* cited by examiner

*Primary Examiner*—Brenda Pham
(74) *Attorney, Agent, or Firm*—Ditthavong Mori & Steiner, P.C.

(57) ABSTRACT

A digital signal-processing device is described which comprises a recording controller for control of recording in the memories drives a trigger-switching element arranged in the trigger line downstream of the two parallel-operating signal-processing units in such a manner that essentially the same timing period is recorded in both memories during a post-triggering period after a trigger time.

11 Claims, 6 Drawing Sheets

SIGNAL-PROCESSING DEVICE WITH IMPROVED TRIGGERING

FIELD OF THE INVENTION

The invention relates to a signal-processing device with improved triggering.

BACKGROUND OF THE INVENTION

When evaluating digital signals, for example, in measuring devices for digital telecommunications signals, especially for the various mobile-telephone standards, various triggerings on the input signal must be implemented.

Regarding the prior art, reference is made, by way of example, to DE 101 59 911 A1, which relates to the triggering of digital input signals. This document deals with different triggering methods at the frame level and the symbol level. A realisation of the triggering at the block-circuit level in digital signal-processing units is not described.

SUMMARY OF THE INVENTION

The present invention, according to various embodiments, is based upon the assumption that the digital signal-processing device has two or more signal branches each comprising parallel-operating signal-processing units and that the result from each signal-processing unit is recorded respectively in a memory. For example, in a first signal branch, the received signal is demodulated while, at the same time, the spectrum is calculated in the other signal branch, the time reference of the two signals being relevant in this context.

The invention, according to one embodiment, provides synchronization for all of the parallel-operating signal branches of a signal-processing device.

According to an embodiment of the invention, it is proposed that the recording controller for control of recording in the memories drives a trigger-switching element arranged in the trigger line downstream of the two parallel-operating signal-processing units in such a manner that essentially the same timing period is recorded in both memories during a post-triggering period after a trigger time.

The memories preferably operate as cyclic memories and, during a pre-triggering period, record the signal-processing result from the respective signal-processing unit. As a result of the triggering according to the invention, both parallel-operating signal-processing units are driven in a synchronous manner, and record in a synchronous manner after the occurrence of a triggering event, that is to say, after a common trigger time, during an equally long post-triggering period in each case.

By means of a switchover device, it is possible to switch between an external trigger signal and, for example, two internal trigger signals. A first internal trigger signal can be generated by the recording controller, while a second internal trigger signal is generated directly by one of the signal-processing units dependent upon an internal triggering event. This internal triggering event can, for example, be the exceeding of a level threshold, and is generated, for example, by continuously monitoring the absolute value of the input signal. If the level exceeds the specified threshold, it can be assumed that this will be followed by a signal portion relevant for recording.

The external trigger signal is generally asynchronous and must first be synchronised, for example, through the edge-sensitive sampling unit. In this context, it is advantageous, in order to increase accuracy, to distinguish between two regions of the clock signal, which serves as a reference signal for the synchronization. The two regions may, for example, be the positive and negative half wave of this clock signal. A special bit of the trigger signal, which is used to distinguish between these two regions, can then be stored in a trigger-offset register.

In general, the output signal sequence will be delayed by comparison with the respective input signal sequence in the signal-processing blocks, of which the signal-processing units of the two signal branches are composed. It is therefore also meaningful to delay the trigger signal by an absolute value, which corresponds to the delay of the output-signal sequence relative to the input-signal sequence, that is to say, to the group delay through the respective signal-processing block.

If a decimation of the digital input signal sequence occurs in the individual signal-processing blocks as a result of undersampling, this reduces the accuracy of the trigger position, if the sampling period of the output signal, which is greater than the sampling period of the input signal by the downsampling factor, is used as the timing grid for the trigger signal. It is then advantageous to provide, in these decimated signal-processing blocks, a special trigger-offset register, which stores the time, at which the trigger signal was displaced by reducing the sampling rate.

It is meaningful to provide for that signal-processing block, which triggers an internal trigger signal, a time-registering device, for example, in the form of a counter, which registers the time required by the trigger signal, after it has been supplied at the input of the signal-processing device until it is supplied to the signal-processing block, which triggers the trigger-signal. This allows a corresponding back-calculation of the triggering times in the past. For example, if the triggering event is the exceeding of a given signal threshold, then it is relevant retrospectively, when the signal portion, which exceeded the threshold value, arrived at the input of the signal-processing device. This can then be reconstructed accordingly.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

An exemplary embodiment of the invention is described in greater detail below with reference to the drawings. The drawings are as follows.

DETAILED DESCRIPTION OF THE PREFERRED EMBODIMENT

Figure 1:
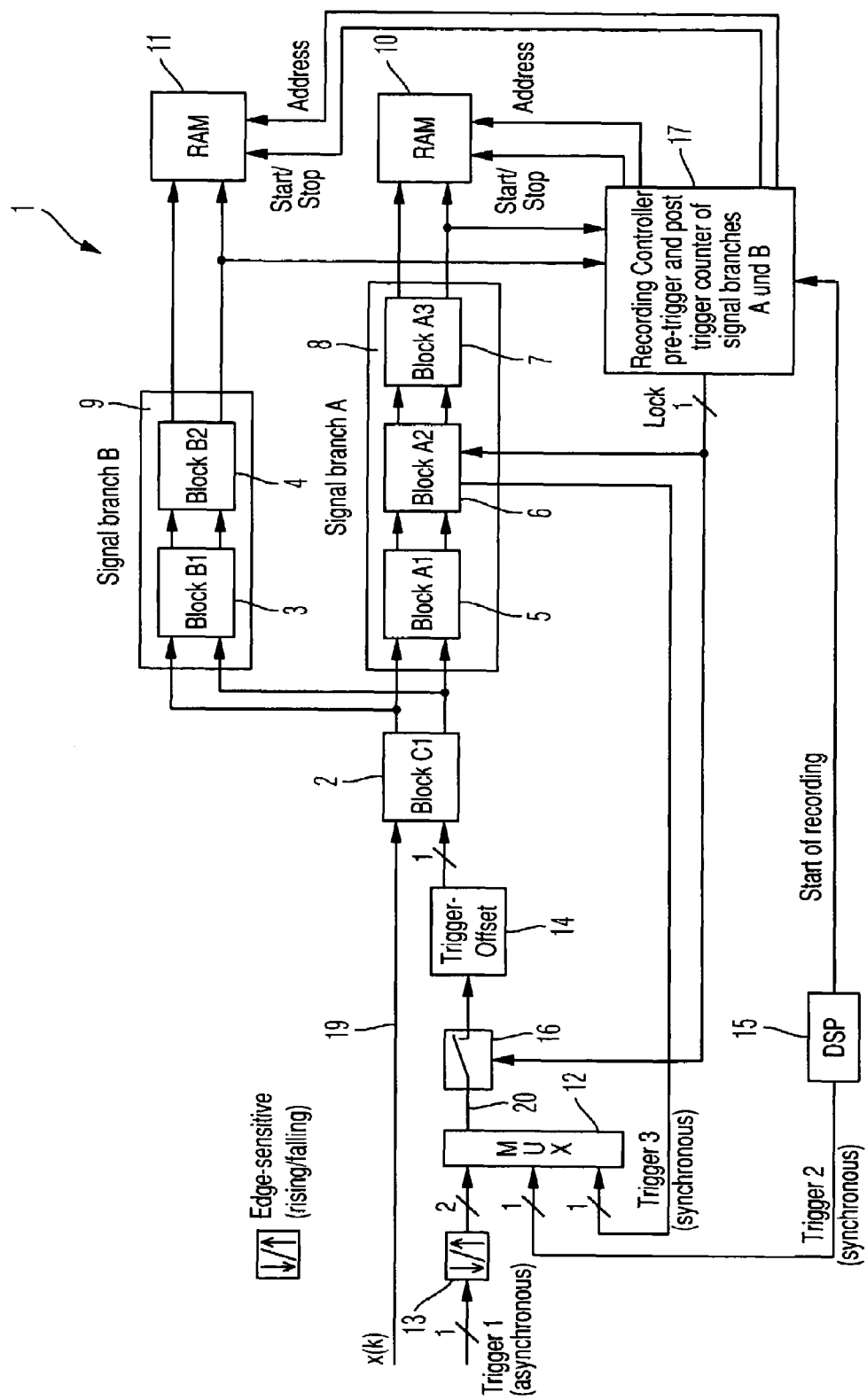
FIG. 1 shows a block circuit diagram of an exemplary embodiment of the signal-processing device according to the invention.

FIG. 1 shows a simplified block-circuit diagram of the signal-processing device 1. In the exemplary embodiment, the signal processing of the digital input sequence x(k) consists of a common Block 2 (Block C1) followed by the two parallel signal branches A and B, which, once again, consist of individual signal-processing blocks 3 and 4 (Blocks B1 and B2) or respectively 5, 6 and 7 (Blocks A1, A2, A3). Typical signal-processing tasks, such as FIR filtering with and without decimation, spectral displacements or the conversion of Cartesian coordinates into polar coordinates are implemented in the individual blocks. While the digital signal sequence is transported on a signal line 19, a trigger line 20 parallel to the latter is present in all stages of the signal processing for the trigger signal.

One peculiarity is the use of the two parallel signal branches A and B in the signal-processing units 8 and 9. Accordingly, the received signal can be demodulated, for example, in signal branch A, while at the same time, in signal branch B, the spectrum is calculated from the observed time interval. The application observed in FIG. 1 is an offline analysis, for which reason the output sequences are first stored in the memories (RAMs) and then read out. In this context, a first memory 10 is provided for signal branch A, and a second memory 11 is provided for signal branch B.

The input signals of the signal branches A and B can be marked with trigger signals. Accordingly, a common time can be marked in the two output sequences of the signal branches A and B, and the time reference between the output signals can therefore be reconstructed.

In order to mark timings of this kind, several triggers signals can be selected. Through the input-end multiplexer 12, it is possible to select between the trigger signals Trigger1 and Trigger2 or Trigger3. The trigger signal Trigger1 marks the timings of the input sequence x(k). This trigger signal is asynchronous to the input sequence x(k) of the digital input signal and is only synchronised by an edge-sensitive sampling in the sampling unit 13. As a result of the two-edge sampling, the time resolution is one half of an input-pulse period with a sampling ratio of one. The necessary information, regarding whether the trigger timing occurred in the positive or negative edge is stored in the trigger-offset register 14. A more detailed description is provided below. Furthermore, a trigger-offset register is provided in each of the decimated blocks, so that the resolution of the trigger timing is not reduced even in the case of decimation.

A synchronous software trigger Trigger2 can be generated through the digital signal processor 15 (DSP). Another alternative is the use of an internally-generated synchronous trigger signal Trigger3, for example, in Block 6 (Block A2). This trigger signal is used to mark relevant events, such as the exceeding of a level, via a pre-determinable threshold.

The trigger signal used is always delayed in the individual blocks in such a manner that the group delays are balanced through pipeline registers. Accordingly, the signal sequence and the trigger signal are delayed equally, which considerably simplifies the reconstruction of the trigger timing in the signal sequence.

The trigger signals can be blocked with the switch element 16 downstream of the multiplexer 12. This ensures that the signal branches A and B respond to the same triggering event.

The pre-trigger and post-trigger counters are implemented in the recording controller 17, so that a pre-determinable observation interval before and after the triggering event is stored in the memories 10 and 11. Separate counters must be provided for each branch because the delays and also the output clock rates of the two signal branches are generally different.

Figure 2:
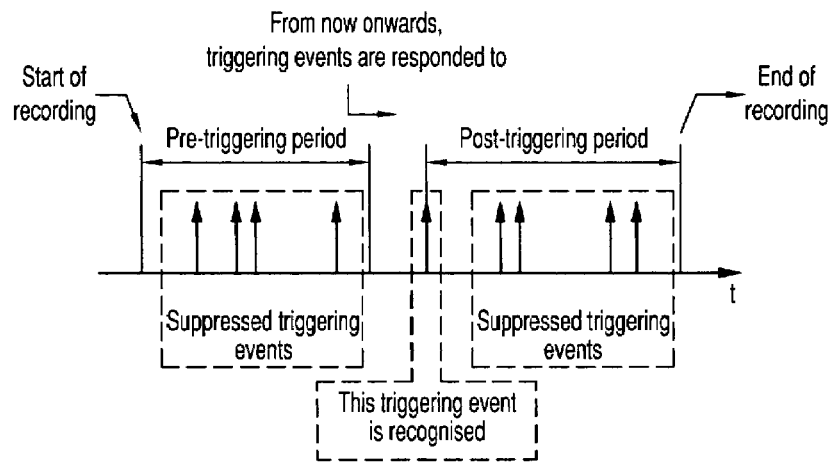
FIG. 2 shows a schematic presentation of the time characteristic of a measurement with pre-triggering and post-triggering period.

FIG. 2 shows the time characteristic of a measurement with pre-triggering and post-triggering period. The recording in the RAMs 10 and 11 takes place in the following stages:

1. The digital signal processor 15 issues the command "Begin recording". From this point in time, the output sequences in the branches A and B are written to the memories 10 and 11. The memories 10 and 11 are written in a cyclical manner, in the manner of a ring memory, that is to say, after all the memory cells have been written, the first-written memory cells are overwritten again.

2. Pre-Triggering Period:

Within the pre-triggering period, recording is implemented without responding to the triggering events. This ensures that a time interval, which has at least the duration of the specified pre-triggering period, is stored in the memory 10 and 11 before the trigger time. Only after the expiry of the pre-triggering period, can there be a response to the triggering event, that is to say, the control signal is set to Lock=1 and closes the input-end switching element 16.

3. Post-Triggering Period:

The post-triggering period begins, if a triggering event occurs after the expiry of the pre-triggering period. At the same time, the control signal is reset to Lock=0, that is to say, all subsequent triggering events are ignored. Recording is stopped after the expiry of the post-triggering period.

Figure 3:
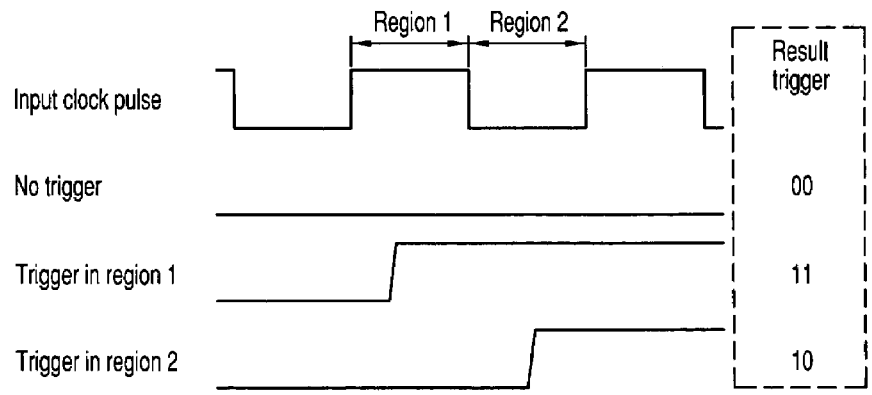
FIG. 3 shows a visualisation of the generation of the trigger information in the different regions of the input clock pulse.

The following section describes the synchronization of the trigger signal. The asynchronous trigger signal Trigger1 is sampled with both edges of the input clock pulse. This achieves a higher time resolution of the triggering event. An input clock pulse with the optimum sampling ratio of one achieves a time resolution of one half of one input clock-pulse period. The time resolution is, in fact, reduced with an unsymmetrical sampling ratio, but it is still more accurate than in the case of the conventional single-edge sampling with a time resolution of only one input clock-pulse period. As a result of the higher time resolution through the two-edge sampling, the sampling of the asynchronous trigger inputs generates a 2-bit item of information. FIG. 3 shows which trigger information is generated in the regions of the input clock pulse.

Figure 4:
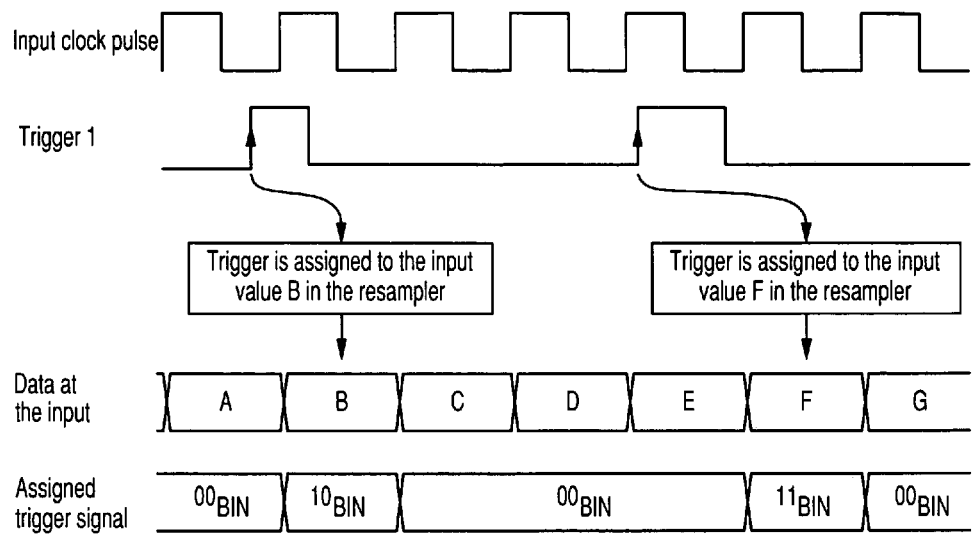
FIG. 4 shows the assignment of an input value to a triggering event.

Of these two bits, only the MSB (Most Significant Bit) is issued to the output of the trigger-offset register 14. The lowest significant bit (LSB) is stored in the trigger-offset register 14. FIG. 4 shows the input value, to which the triggering event is assigned.

A further improvement in resolution is achieved, if the frequency of the input clock pulse is increased by a factor N with an unchanged clock-pulse rate of the input sequence x(k). For example, in the case of a doubling (N=2), the result is a time resolution of one quarter of one clock-pulse period of the input sequence. As a result of the broader range of offset values, the trigger-offset register 14 must be designed to be correspondingly broader.

The trigger signal selected by the multiplexer 12 is guided via the controllable switching element 16. Accordingly, the trigger input can be locked. The concept here is that a triggering event is only allowed into the signal-processing unit, if it actually also triggers the post-triggering period. Whether the switching element 16 locks or not is determined via the Lock control line of the recording controller 17. The switching element 16 preferably provides the following two operating modes:

In the operating mode "Single", only the first triggering event is allowed through after the switch 16 has been closed. After this, the switch 16 is automatically opened again, and the trigger input is therefore locked. This ensures that this triggering event starts the post-triggering period of branch A and branch B. Otherwise, different triggering events could start the counters. The trigger offsets from this triggering event are stored in the blocks with decimation. Only a new unlocking of the trigger input allows the next triggering event through. This operating mode is always assumed in the following sections.

By contrast, in the operating mode "All", all triggering events are allowed through after the unlocking of the trigger input. This operating mode can be selected, if the time reference of the triggering events between the two signal branches is not relevant.

Downstream of the switching element 16, the offset of the triggering event is evaluated. In this case, the offset is the information regarding whether the trigger has occurred in region 1 or region 2 (cf. FIG. 4) of the input clock pulse. The trigger-offset register 14 is set by the first triggering event, which passes through the switching element 16. During operation, it must be possible to delete the trigger-offset register 14 again.

Figure 5:
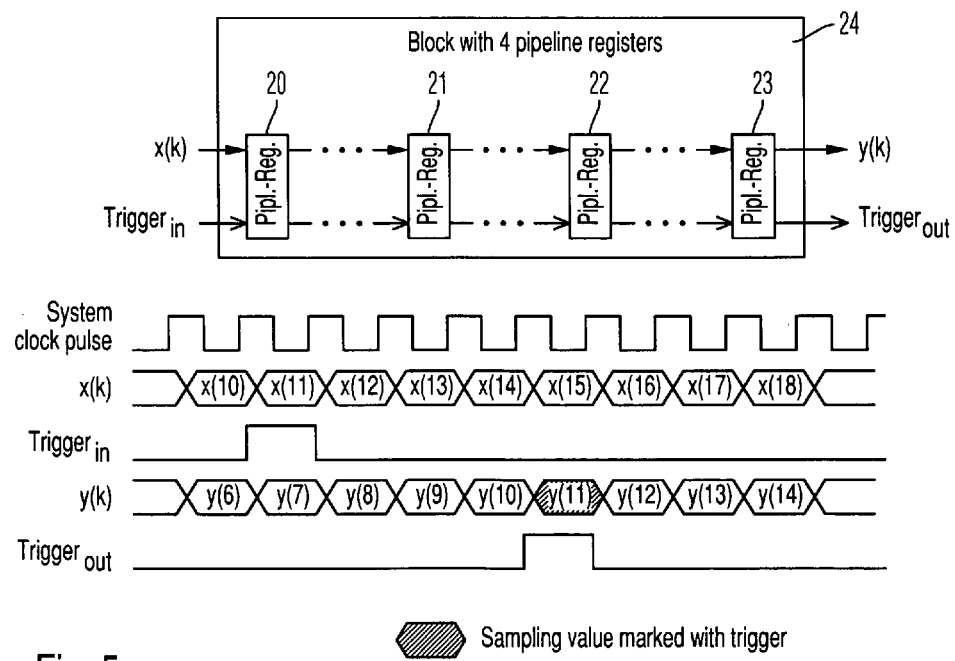
FIG. 5 shows the delay of the trigger signal in a block with four pipeline registers.

Pipeline registers are used in the signal path. For the following reason, the trigger signal must also be correspondingly delayed by the same number of pipeline registers. In determining the exact trigger timing point after the expiry of a measurement, it is not necessary to calculate how many pipeline registers were used in this measurement. This considerably simplifies the procedure. FIG. 5 shows how the trigger signal in a block 24 with four pipeline registers 20-23 is delayed. FIG. 5 does not show the actual timing, but is only intended to illustrate the principle. The signals Trigger$_{in}$ and Trigger$_{out}$ mark, in the input sequence and in the output sequence, the sampling value, at which a triggering event has occurred. In the example, this is the case with the 11$^{th}$ input value. The input signal is delayed through the four pipeline registers 20-23 by four input clock pulses.

Figure 6:
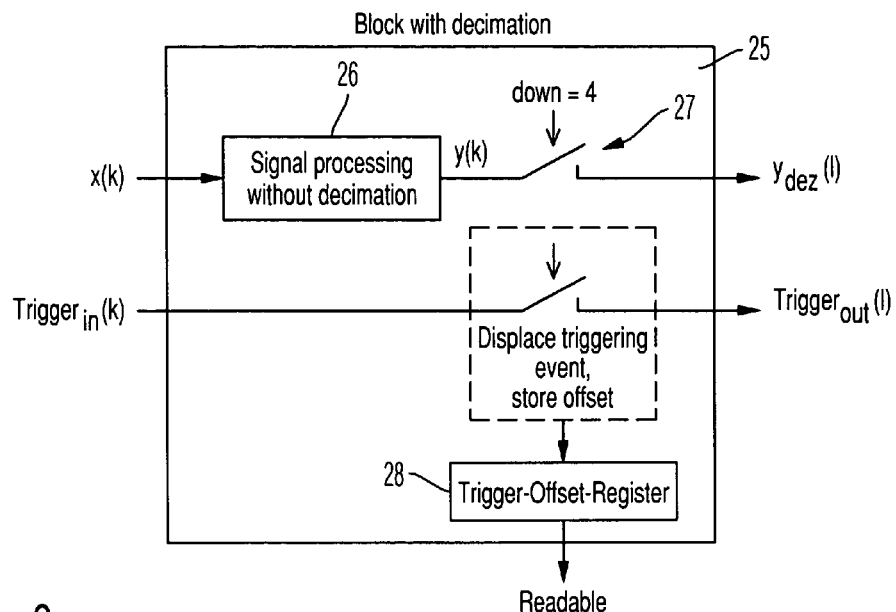
FIG. 6 shows an example, in which decimation by the factor 4 is carried out in a signal-processing block.

To ensure that only that value, at which the triggering event has occurred, continues to be marked from block to block, the triggering event must also be decimated in the case of a block with decimation. FIG. 6 shows an example, in which decimation by a factor 4 is carried out in a block. Determined by the multi-rate signal processing, trigger signals in the modules must also be converted with a conversion of the sampling rate (re-sampling). However, the process of decimation of triggering events also leads to a reduction in the time resolution of the trigger signals. If undersampling is implemented, the triggering event must be displaced to the next output value. This process reduces the time resolution to one output clock-pulse period. As shown in FIG. 6, a block 25 with decimation can be broken down conceptually into a signal-processing unit 26 without decimation and a down-sampling unit 27. In order to avoid obtaining a loss of time resolution in the case of integer down-sampling, the time by which the triggering event is displaced, is stored in a trigger-offset register 28.

Figure 7:
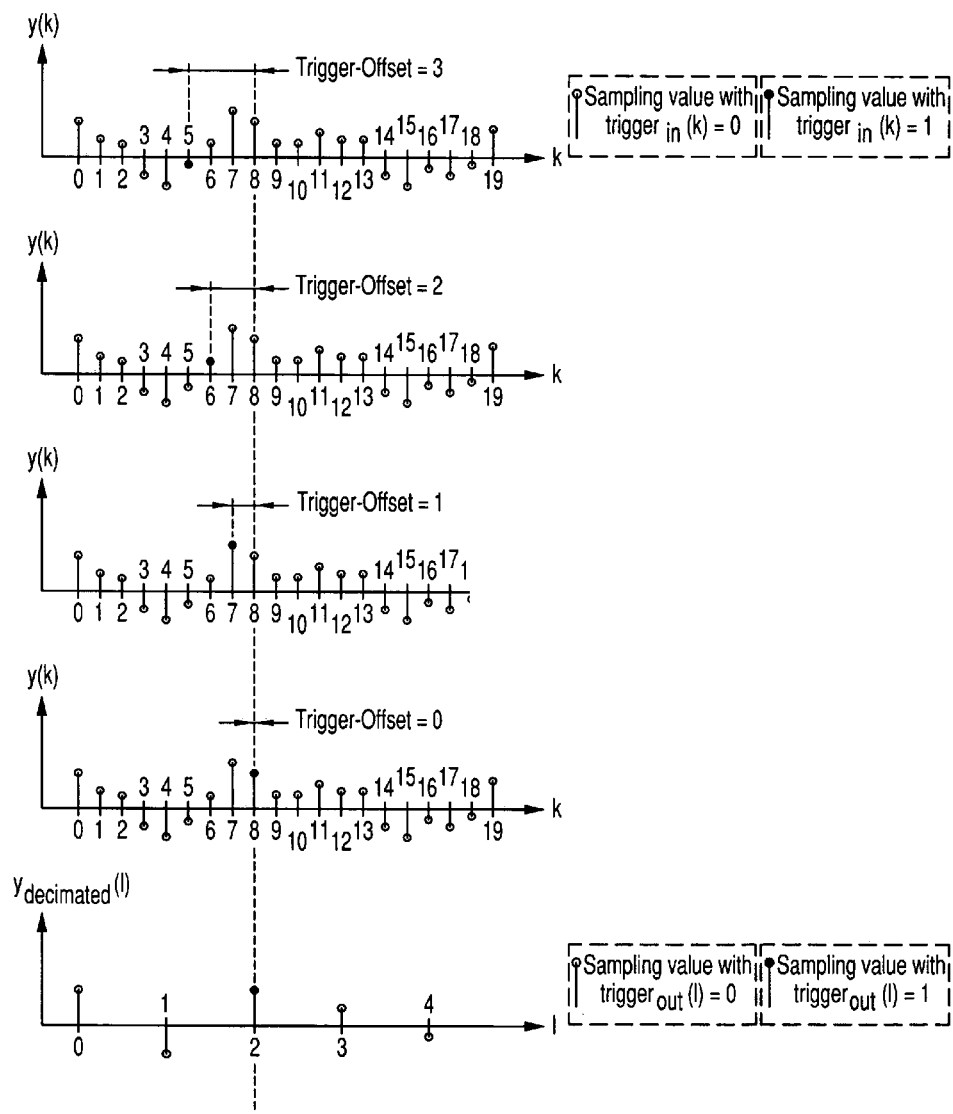
FIG. 7 shows a visualisation of the trigger offset.

FIG. 7 provides an example for a block with the down-sampling factor 4. With this down-sampling, there are a total of four possible positions for an active trigger marking in the non-decimated output sequence y(k), which lead to the same marking in the decimated output sequence $y_{dez}$(l). The example shows all four possibilities. In order to distinguish where the marking was disposed, the indicated trigger offset is stored in a register referred to as the trigger-offset register 28.

In each block with down-sampling, there must be a trigger-offset register 28 for each trigger signal. If every active trigger marking were to set the trigger-offset register 28, it would no longer be possible to assign accurately which marking the register 28 had set. For this reason, only the first active trigger marking sets the trigger-offset register 28; this is ensured by locking the subsequent triggering events by opening the trigger-switching element 16. Subsequent active markings do not initially lead to a resetting of the register 28.

Accordingly, the simple calculation specification for calculating the relevant trigger offset time $T_{Offset-all}$ is obtained from the observed signal branch through undersampling in the stored output sequence:

$$T_{\text{Offset\_all}} = \sum_{\alpha=1}^{\text{nof\_dec\_blocks}} \text{Trigger} - \text{Offset}(\alpha) \cdot T_{in}(\alpha),$$

wherein

Trigger-offset($\alpha$) is the offset value of the block $\alpha$ stored in the register, $T_{in}(\alpha)$ is the input clock-pulse period of block $\alpha$ and nof_dec_Blocks is the number of decimated blocks of the observed signal branch.

Two substantial problems occur during triggering.

The trigger-offset registers 28 in the decimated blocks 25 can only evaluate one triggering event. It must therefore be ensured that these registers are also only set for the triggering event which also triggers the post-triggering period.

A fixed time reference must exist between the measurement in the signal branch A and the measurement in the signal branch B. This functions only if two branches respond to the same triggering event.

The following section first explains how it be can ensured that all offset registers 28 are set by the same triggering event and that this triggering event also triggers the post-triggering period. If these registers 28 were re-set at the start of recording, they would already have been set by the first, suppressed triggering event. However, after the expiry of the pre-triggering period, if only the first offset register 28 is deleted, it is possible that a triggering event is already disposed in the blocks 2-9, and all of the offset registers 28 are therefore no longer set, or the offset registers 28 are not set by the same triggering event. This makes it necessary for triggering events to be allowed through the switching element 16 at the input only after the pre-triggering period has elapsed. The Lock control signal required for this purpose is generated in the recording controller 17.

Figure 8:
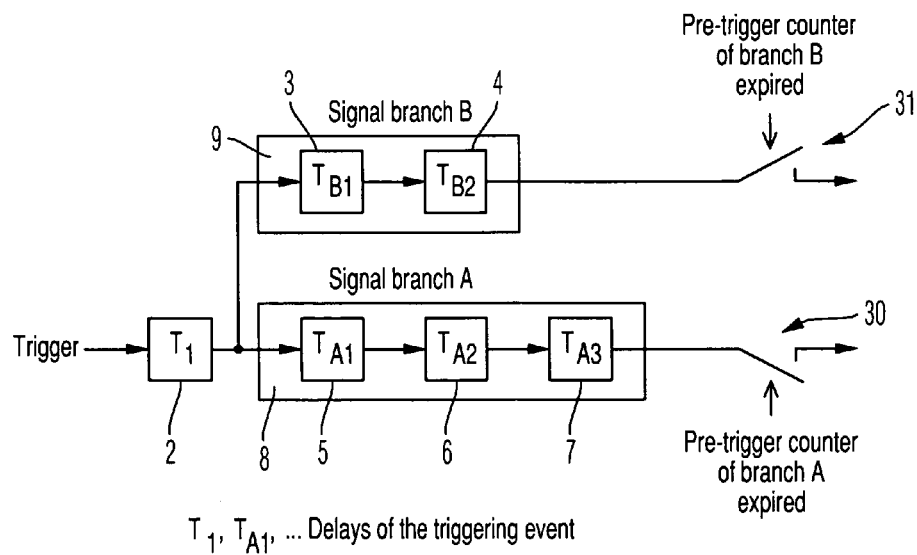
FIG. 8 shows a first exemplary embodiment for the realisation of the pre-triggering.

In the following section, the necessity for the trigger-switching element at the input is explained in greater detail with reference to how a shared time reference between the signal branch A and B is achieved. A fixed time reference is present, if the post-triggering period is started with the same triggering event in both signal branches. Consider first the thought experiment in FIG. 8. One pre-trigger counter is running in each of the two signal branches. If each signal branch responds to a triggering event, when its own pre-trigger counter has expired, the time reference between the signal branches will be unclear, because different triggering events can be recognised. Even if the switches 30, 31 in FIG. 8 are closed only after the expiry of both pre-trigger counters, it is still not certain whether both signal branches are responding to the same triggering event, because the delays in the two paths can be very different. As a result of the different delays in the two signal branches, the triggering event, which starts the post-triggering period in signal branch B, for example, may already have left signal branch A. Accordingly, in this example, signal branch A would respond to another, later triggering event.

Figure 9:
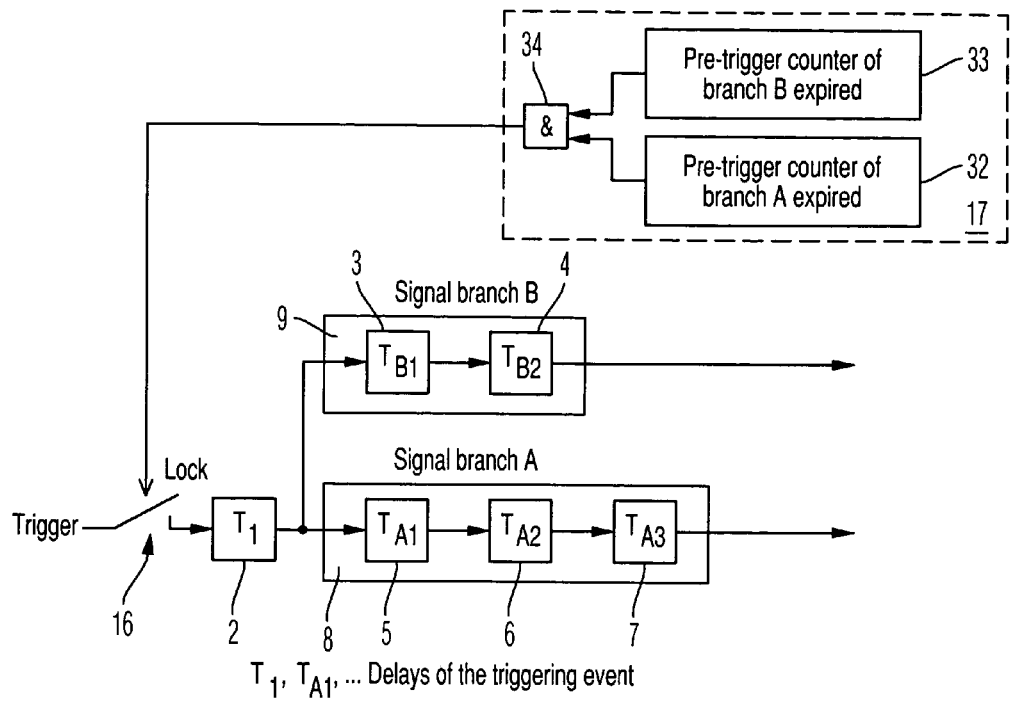
FIG. 9 shows a second exemplary embodiment for the realisation of the pre-triggering and FIG. 10 shows an example of the generation of the internal trigger in the case of a Cordic block.

Unlocking the trigger input only when both pre-trigger counters have expired ensures that the first permitted triggering event also starts the post-triggering period in both branches. However, this unlocking with the Lock control signal must take place before the position, at which the input data divide into the two branches. FIG. 9 shows how the inputs must be locked through the pre-trigger counters. The pre-trigger counters 32, 33 of both signal branches must have expired, before the triggering is unlocked by the Lock control signal. This is visualised in FIG. 9 by the AND element 34. As soon as a triggering event has passed through the switching element 16, the switching element 16 must be opened again, because otherwise, the trigger offset determined in the blocks 2-7 would be overwritten.

The internal trigger signal Trigger3, which will be investigated in greater detail below, can be used alongside the trigger signal Trigger1 and the software trigger Trigger2. Additional rules must be observed if a fixed time reference between the two signal branches is also to exist at the same time with an internal trigger generation.

Figure 10:
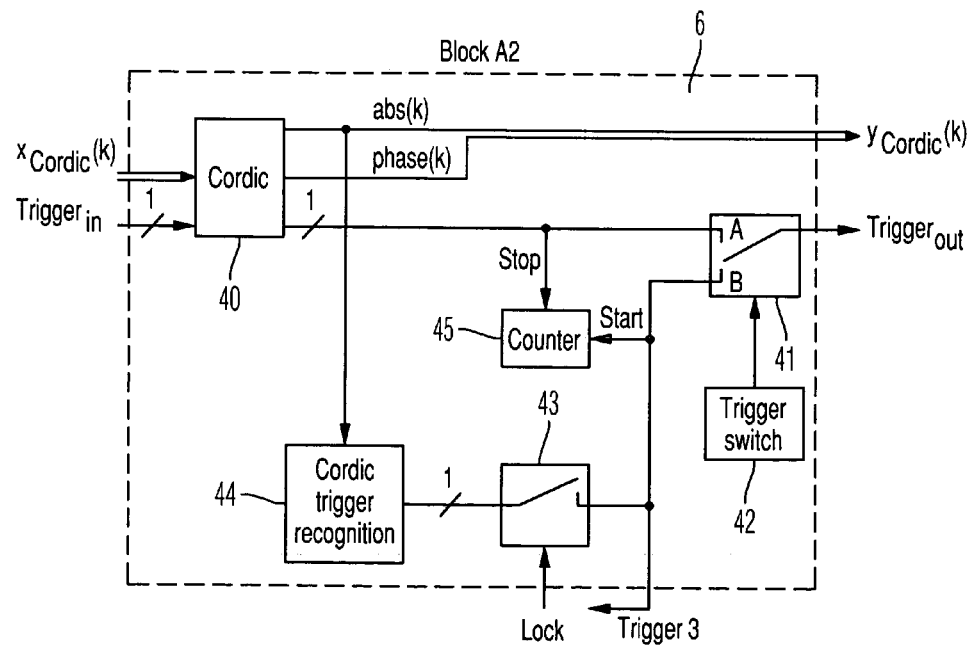

The Cordic block 6 in FIG. 10 will now be considered as an example by way of further explanation of the generation of an internal trigger. The absolute value abs(k) and the phase phase (k) of the input sequence is calculated in the Cordic unit 40. If the absolute value exceeds a pre-determinable threshold value, an internal triggering event is generated.

If a time reference between the two signal branches is not to be provided, the internal triggering event is passed directly to the output of the Cordic block. In this case, the switching position B for the switch 41 is selected by the switch controller 42. Since it is not yet clear, whether the pre-triggering period has elapsed, because the triggering event must still pass through the remaining blocks 7 to the output, all of the triggering events must be passed on. The post-triggering period begins if such a triggering event appears at the output, and if the pre-triggering period has elapsed.

However, if a time reference between the two signal branches is to be provided again, the trigger signal generated in the Cordic unit 40 must be supplied to the input of the signal processor via the trigger signal Trigger3, that is to say, in this case, a triggering event is not supplied directly to the Cordic block. In this case, the switching position A for the switch 41 is selected by the switch controller 42. The triggering event is only passed on at the input, if the pre-triggering period has elapsed in both branches. After the expiry of the pre-triggering periods, the control signal is activated to Lock=1 and the switch 43 is closed. The triggering event recognised by the trigger recognition device 44 then passes through the two branches as the trigger signal Trigger3 and triggers the post-triggering period.

With this operating mode, a later output value is therefore marked, because the trigger signal is fed back to the input. Accordingly, the triggering event is delayed by the group delay of the blocks 2 and 5 upstream of the Cordic block 6. In order to resolve this problem, a counter 45 in the Cordic block 6, which counts the number of values until the supplied triggering event appears in the Cordic block 6 again and in fact at the same position, where the triggering event was also recognised and the counting started, is started upon recognition of the triggering event. Accordingly, the time of exceeding the threshold value is reconstructed by displacing the marking by the time $$dT = \text{Counter} \cdot T_{in}$$

in the direction towards the past. The clock rate of the input and trigger sequence in the Cordic block 6 is defined in the formula as $T_{in}$.

The invention is not restricted to the exemplary embodiment described above and presented in the drawings, but is also suitable for other signal processing configurations. Furthermore, all of the elements described can be combined with one another in any required manner.

While the present invention has been described in connection with a number of embodiments and implementations, the present invention is not so limited but covers various obvious modifications and equivalent arrangements, which fall within the purview of the appended claims.

What is claimed is:

1. A digital signal-processing device comprising:
   a first signal-processing unit for a first signal branch, of which the signal-processing result is recorded in a first memory;
   at least one second signal-processing unit operating in parallel to the first signal-processing unit for a second signal branch, of which the signal-processing result is recorded in a second memory; and
   a recording controller for controlling the recording in the first memory and in the second memory,
   wherein the recording controller drives a trigger-switching element, arranged in a trigger line upstream of the two parallel-operating signal-processing units, in such a manner that essentially the same timing period during a post-triggering period after a trigger time is recorded in both memories.

2. A digital signal-processing device according to claim 1, further comprising:
   a switchover device for switching between an external trigger signal and a first internal trigger signal generated by the recording controller or a second internal trigger signal generated by one of the signal-processing units.

3. A digital signal-processing device according to claim 2, further comprising:
   an edge-sensitive sampling unit configured to sample the external trigger signal in an edge-sensitive manner with reference to a clock signal.

4. A digital signal-processing device according to claim 3, further comprising:
   a first trigger-offset register configured to store whether the rising or falling edge of the external trigger signal occurred in a first region or in second region of the clock signal, the first trigger-offset register being connected downstream of the edge-sensitive sampling unit.

5. A digital signal-processing device according to claim 1, wherein
   the signal-processing units each comprise one or more signal-processing blocks and that, in each signal-processing block, in which a delay of the digital output sequence relative to the digital input sequence occurs, the trigger signal is delayed by a value, which corresponds to the group delay of the input sequence through the relevant signal-processing block.

6. A digital signal-processing device according to claim 1, wherein the signal-processing units each comprise one or more signal-processing blocks and that, in each signal-processing block, in which a decimation of the digital input sequence takes place through a reduction of the sampling rate, an assigned trigger-offset register stores the time, at which the trigger signal was displaced by the reduction of the sampling rate.

7. A digital signal-processing device according to claim 1, further comprises a first time-registering device for registering a pre-triggering period at least preceding the trigger time for the first signal branch and a second time-registering device for registering a pre-triggering period at least preceding the trigger time for the second signal branch are present in the recording controller, and that the trigger-switching element is only driven, when the pre-triggering periods registered by the two time recording devices have elapsed.

8. A digital signal-processing device according to claim 7, wherein the outputs of the time-registering devices are connected to one another by a logical AND linking element.

9. A digital signal-processing device according to claim 1, wherein the signal-processing units each comprise one or more signal-processing blocks and that at least one signal-processing block for generating an internal trigger signal.

10. A digital signal-processing device according to claim 9, wherein each signal-processing block, which generates an internal trigger signal, provides a trigger-recognition device, downstream of which a trigger-switching element is connected, which only allows a trigger signal generated by the trigger-recognition device to pass to the signal-processing units, when it is driven by the recording controller.

11. A digital signal-processing device according to claim 9, wherein each signal-processing block, which generates an internal trigger signal provides a time-registering device, which registers the delay of the trigger signal up to the relevant signal-processing block through all of the upstream-connected signal-processing blocks.

* * * * *